(12) United States Patent
Zadesky et al.

(10) Patent No.: US 8,159,777 B2
(45) Date of Patent: Apr. 17, 2012

(54) PORTABLE ELECTRONIC DEVICE WITH MULTIPURPOSE HARD DRIVE CIRCUIT BOARD

(75) Inventors: Stephen P. Zadesky, Portola Valley, CA (US); Christopher D. Prest, Mountain View, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 576 days.

(21) Appl. No.: 12/360,815

(22) Filed: Jan. 27, 2009

(65) Prior Publication Data
US 2009/0316351 A1    Dec. 24, 2009

Related U.S. Application Data

(60) Provisional application No. 61/074,126, filed on Jun. 19, 2008.

(51) Int. Cl.
*G11B 5/012* (2006.01)
(52) U.S. Cl. .................................. 360/97.01
(58) Field of Classification Search ................ 360/97.01
See application file for complete search history.

(56) References Cited

U.S. PATENT DOCUMENTS

| | | | |
|---|---|---|---|
| 4,800,461 A * | 1/1989 | Dixon et al. | 361/751 |
| 4,803,986 A * | 2/1989 | Dufresne et al. | 607/115 |
| 4,931,134 A * | 6/1990 | Hatkevitz et al. | 216/17 |
| 5,235,482 A | 8/1993 | Schmitz | |
| 5,396,384 A | 3/1995 | Caldeira et al. | |
| 5,454,080 A | 9/1995 | Fasig et al. | |
| 5,760,986 A | 6/1998 | Morehouse et al. | |
| 5,778,418 A * | 7/1998 | Auclair et al. | 711/101 |
| 5,863,666 A * | 1/1999 | Merchant et al. | 428/544 |
| 6,012,145 A | 1/2000 | Mathers et al. | |
| 6,094,984 A * | 8/2000 | Asano et al. | 73/493 |
| 6,108,162 A | 8/2000 | Amirkiai et al. | |
| 6,118,604 A * | 9/2000 | Duffy | 360/48 |
| 6,430,000 B1 | 8/2002 | Rent | |
| 6,639,791 B2 | 10/2003 | Su | |
| 6,694,200 B1 * | 2/2004 | Naim | 700/94 |
| 6,891,721 B2 | 5/2005 | Huang | |
| 2001/0010303 A1 * | 8/2001 | Caron et al. | 216/18 |
| 2004/0037007 A1 * | 2/2004 | Rugg et al. | 360/245.9 |
| 2004/0088456 A1 * | 5/2004 | Zhang | 710/74 |
| 2006/0049788 A1 * | 3/2006 | Kifuku et al. | 318/432 |
| 2006/0238517 A1 * | 10/2006 | King et al. | 345/173 |
| 2007/0232098 A1 * | 10/2007 | Danner | 439/131 |
| 2008/0047135 A1 * | 2/2008 | Arnold | 29/829 |
| 2009/0147456 A1 * | 6/2009 | Kim et al. | 361/679.21 |

* cited by examiner

*Primary Examiner* — Hoai V Ho
*Assistant Examiner* — Jay Radke
(74) *Attorney, Agent, or Firm* — Treyz Law Group; G. Victor Treyz; David C. Kellogg

(57) ABSTRACT

A hard drive for a portable electronic device is provided that contains a multipurpose circuit board. The multipurpose circuit board may be mounted within a hard drive housing. System components and hard drive controller components may be mounted to the multipurpose circuit board. The multipurpose circuit board may be formed from a rigid flex structure or other structure that is able to accommodate translation of the multipurpose circuit board relative to the remainder of the portable electronic device in the event of an impact event. Components may be mounted to the multipurpose board in accordance with their heights. The portable electronic device may include components such as a battery, display, buttons, and other input-output devices that are connected to the multipurpose circuit board via flex circuit portions of a rigid flex or other electrical paths.

18 Claims, 12 Drawing Sheets

PORTABLE ELECTRONIC DEVICE WITH MULTIPURPOSE HARD DRIVE CIRCUIT BOARD

This application claims the benefit of provisional patent application No. 61/074,126, filed Jun. 19, 2008, which is hereby incorporated by reference herein in its entirety.

BACKGROUND

This invention relates generally to electronic devices, and more particularly, to electronic devices such as portable electronic devices with hard drive circuit boards that use space efficiently.

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Portable devices often use printed circuit boards. Components that may be mounted to printed circuit boards include integrated circuits, discrete electrical components such as resistors, capacitors, and inductors, and other components such as electrical connectors. Portable devices also may include mass storage devices such as hard drives. Hard drives are controlled by control circuits that are mounted on a hard drive controller printed circuit board. These control circuits are used for functions such as motor control and read-write head placement. To minimize the amount of space that is consumed in a modern small-form-factor hard drive, the hard drive controller printed circuit board is typically mounted within the housing of the hard drive. Although this type of arrangement may be acceptable in some applications, it may lead to packaging inefficiencies. For example, even though space is at a premium in many portable electronic devices, hard drive controller printed circuit boards tend to be sparsely populated. Underutilization of the real estate on hard drive controller boards in this way can be wasteful.

It would therefore be desirable to be able to provide improved hard drive arrangements for portable electronic devices.

SUMMARY

Portable electronic devices and circuit board structures for use in portable electronic devices are provided. The circuit board structures may include circuit board structures associated with hard drives. A hard drive printed circuit board may be provided with both hard drive controller circuits and integrated circuits and other components that are not directly associated with operating the hard drive. This allows real estate to be used more efficiently within a portable electronic device.

Further features of the invention, its nature and various advantages will be more apparent from the accompanying drawings and the following detailed description of the preferred embodiments.

DETAILED DESCRIPTION

The present invention relates generally to electronic devices, and more particularly, to portable electronic devices such as handheld electronic devices.

The portable electronic devices may be laptop computers or small portable computers of the type that are sometimes referred to as ultraportables. Portable electronic devices may also be somewhat smaller devices. Examples of smaller portable electronic devices include wrist-watch devices, pendant devices, headphone and earpiece devices, and other wearable and miniature devices.

The portable electronic devices may be, for example, handheld electronic devices such as cellular telephones, media players with wireless communications capabilities, handheld computers (also sometimes called personal digital assistants), remote controllers, global positioning system (GPS) devices, and handheld gaming devices. Handheld electronic devices may also be hybrid devices that combine the functionality of multiple conventional devices. Examples of hybrid electronic devices include a cellular telephone that includes media player functionality, a gaming device that includes a wireless communications capability, a cellular telephone that includes game and email functions, and a portable device that receives email, supports mobile telephone calls, has music player functionality and supports web browsing. These are merely illustrative examples.

Figure 1:
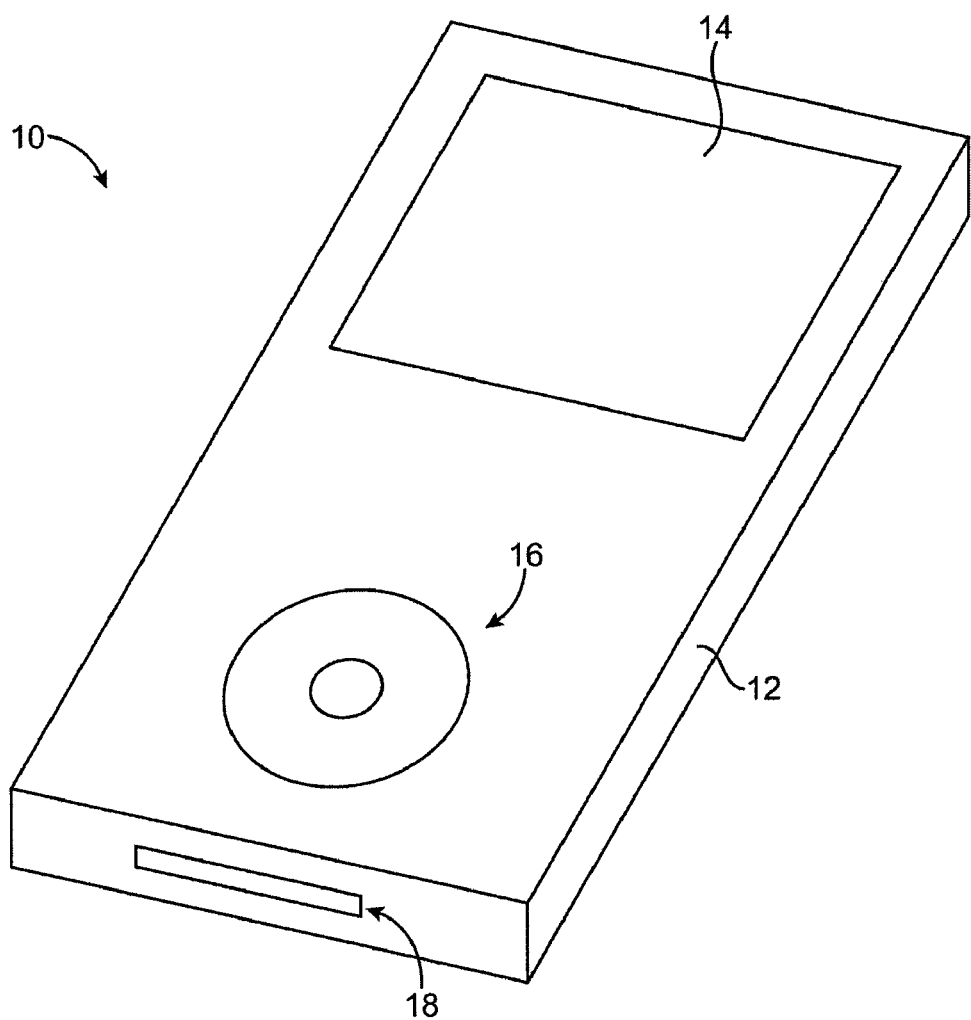
FIG. 1 is a perspective view of an illustrative portable electronic device in accordance with an embodiment of the present invention.

An illustrative portable electronic device in accordance with an embodiment of the present invention is shown in FIG. 1. Device 10 of FIG. 1 may be, for example, a handheld electronic device that supports media file playback functions. If desired, device 10 may include wireless capabilities such as 2G and/or 3G cellular telephone and data functions, global positioning system capabilities, and local wireless communications functions (e.g., IEEE 802.11 and Bluetooth®). Device 10 may also be used to implement functions for internet browsing, email and calendar applications, games, other suitable applications, etc.

Device 10 may have housing 12. Housing 12, which is sometimes referred to as a case, may be formed of any suitable materials including, plastic, glass, ceramics, metal, other suitable materials, or a combination of these materials. In arrangements in which device 10 includes wireless communications circuitry, housing 12 or portions of housing 12 may be formed from a dielectric or other low-conductivity material, so that the operation of conductive antenna elements that are located in proximity to housing 12 is not disrupted. Housing 12 or portions of housing 12 may also be formed from conductive materials such as metal.

Device 10 may have one or more displays such as display 14. Display 14 may be a liquid crystal display (LCD), an organic light emitting diode (OLED) display, or any other suitable display. The outermost surface of display 14 may be formed from one or more plastic or glass layers. If desired, touch screen functionality may be integrated into display 14 or may be provided using a separate touch pad device. An advantage of integrating a touch screen into display 14 to make display 14 touch sensitive is that this type of arrangement can save space and reduce visual clutter and can allow the area of display 14 to be maximized.

Device 10 may also include an input-output device such as controller 16. Controller 16 may be, for example, a click wheel that includes multiple buttons. Signals may also be conveyed in and out of device 10 using audio jacks and other connectors. As an example, device 10 may have a connector such as 30-pin connector 18. Connector 18 may be used to convey data and power signals to device 10 (e.g. when device 10 is mounted in a dock or is connected to a 30-pin data cable). Connector 18 may also be used to convey signals out of device 10.

Display screen 14 (e.g., a touch screen), click wheel buttons 16, and connector 18 are merely examples of input-output devices that may be used with electronic device 10. If desired, electronic device 10 may have other input-output devices. For example, electronic device 10 may have user input control devices such as on-off buttons and other buttons, additional input-output jacks (e.g., for audio and/or video), speakers, microphones, etc. The input-output device arrangement of FIG. 1 is shown as an example.

Figure 2:
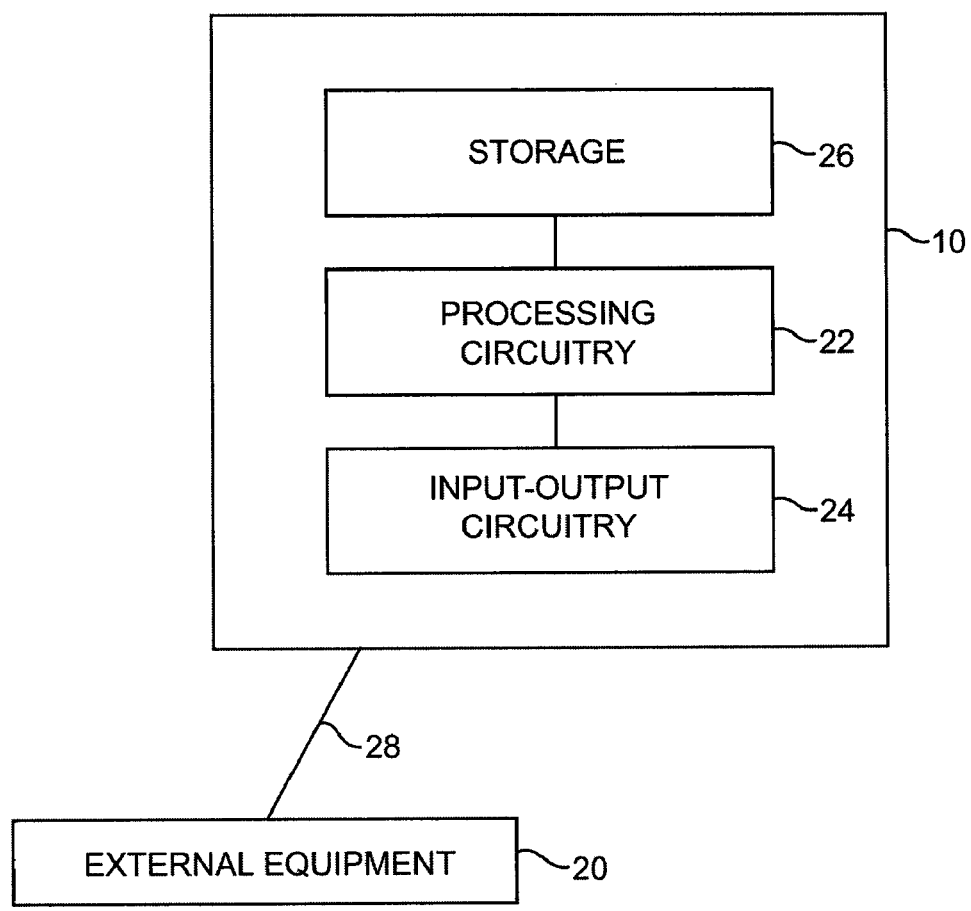
FIG. 2 is a schematic diagram of an illustrative portable electronic device in accordance with an embodiment of the present invention.

A schematic diagram of a portable electronic device such as handheld electronic device 10 of FIG. 1 is shown in FIG. 2. As shown in FIG. 2, device 10 may include storage 26. Storage 26 may include one or more different types of storage such as hard disk drive storage, a solid state drive or other storage device that includes nonvolatile memory (e.g., flash memory or other electrically-programmable-read-only memory) or volatile memory (e.g., static or dynamic random-access-memory), etc.

Processing circuitry 22 may be used to control the operation of device 10. Processing circuitry 22 may be based on a processor such as a microprocessor and other suitable integrated circuits. With one suitable arrangement, processing circuitry 22 and storage 26 may be used to run software on device 10, such as internet browsing applications, voice-over-internet-protocol (VOIP) telephone call applications, email applications, media playback applications, operating system functions, etc. Processing circuitry 22 and storage 26 may be used in implementing communications protocols such as serial and parallel bus communications protocols, internet protocols, wireless local area network protocols (e.g., IEEE 802.11 protocols—sometimes referred to as Wi-Fi®), protocols for other short-range wireless communications links such as the Bluetooth® protocol, protocols for handling 3G communications services (e.g., using wide band code division multiple access techniques), 2G cellular telephone communications protocols, etc.

Input-output circuitry 24 may be used to allow data to be supplied to device 10 and to allow data to be provided from device 10 to external equipment 20. Display screen 14, click wheel 16, and dock connector 18 of FIG. 1 are examples of input-output circuitry 24.

Input-output circuitry 24 can include user input-output devices such as buttons, touch screens, joysticks, click wheels, scrolling wheels, touch pads, key pads, keyboards, speakers, microphones, cameras, etc. A user can control the operation of device 10 by supplying commands through such user input devices. Display and audio devices within circuitry 24 may include liquid-crystal display (LCD) screens or other screens, light-emitting diodes (LEDs), and other components that present visual information and status data. Audio-video interface equipment in circuitry 24 such as jacks and other connectors may be used to form connections with external headphones and monitors.

Input-output circuitry 24 may, if desired, include wireless communications circuitry such as radio-frequency (RF) transceiver circuitry formed from one or more integrated circuits, power amplifier circuitry, passive RF components, antennas, and other circuitry for handling RF wireless signals. Wireless signals can also be sent using light (e.g., using infrared communications).

Device 10 can communicate with external equipment 20 over paths such as path 28. Path 28 may include wired and wireless paths. External equipment 20 may include accessories such as headphones (e.g., a wireless cellular headset or audio headphones) and audio-video equipment (e.g., wireless speakers, a game controller, or other equipment that receives and plays audio and video content), a peripheral such as a wireless printer or camera, etc. External equipment 20 may also include equipment such as an associated wireless access point (router) or an internal or external wireless card that establishes a wireless connection with device 10. A computer such as a personal computer may be included in external equipment 20 and may form a connection with device 10 using a connector such as connector 18 of FIG. 1, using a wireless link, or using any other suitable communications path. If desired, external equipment 20 may include network equipment such as a cellular telephone base station, equipment in a local area network, etc.

In a typical portable electronic device, it may be desirable to store media on a hard disk drive. Handheld electronic devices may, for example, use compact hard drives such as hard drives with platters of 1.8 inches in diameter (so-called 1.8 inch drives). A conventional hard drive of this type is shown in FIG. 3.

Figure 3:
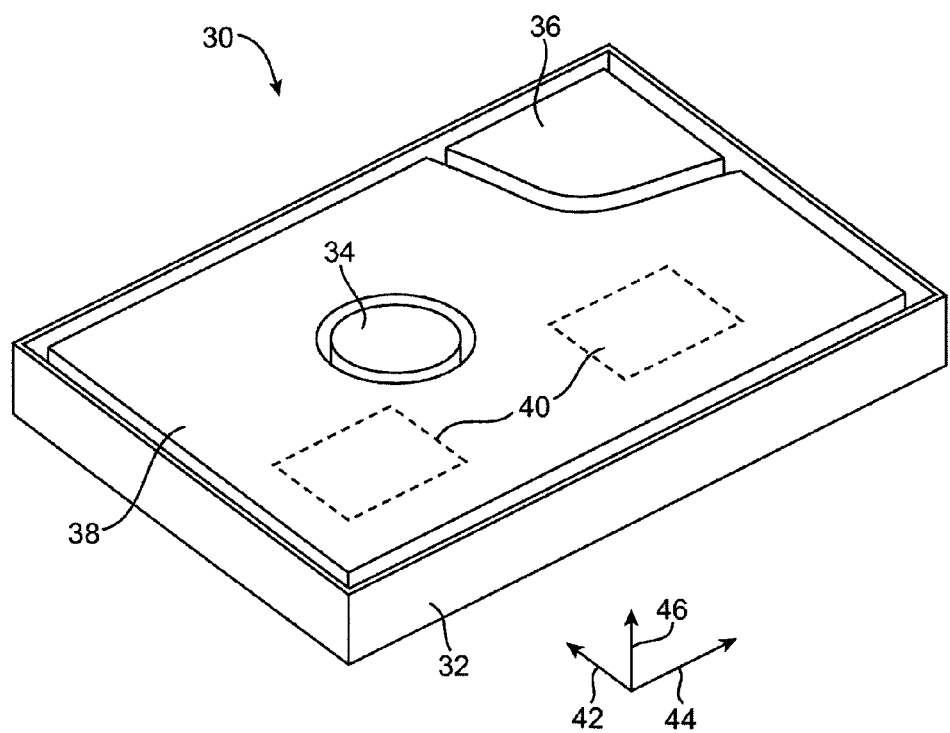
FIG. 3 is a perspective view of a conventional hard drive having an integrated hard drive controller printed circuit board.

As shown in FIG. 3, hard drive 30 has a metal case 32. Metal case 32 has a longitudinal dimension parallel to direction 44, a lateral dimension parallel to direction 42, and a height or "z" dimension parallel to direction 46.

One or more magnetic platters may be connected to motor spindle 34. During operation, a motor in drive 30 rotates spindle 34 to spin the platter. A read-write head is used to access data on the spinning platter. The head may be mounted to an actuator arm. Actuator 36 may be used to control the angular position of an actuator arm and thereby control the location of the head during read and write operations.

The dimensions of hard drive 30 are limited by its components. For example, the height of drive 30 is generally limited by the required height of spindle 34 and its motor. If spindle 34 and the motor that is used to drive spindle 34 are reduced appreciably in size, it will not be possible to adequately spin the hard drive platters. Similarly, if the height of actuator 36 is reduced appreciably, the actuator will not be able to satisfactorily move the actuator arm and hard drive head.

Because of the height requirements of actuator 36 and motor 34, there is generally a recess available within case 32 above the drive platters. This recess is typically used to mount a hard drive controller printed circuit board such as board 38. As shown in FIG. 3, components 40 may be mounted to the underside of printed circuit board 38. These components may include integrated circuits and other devices for controlling motor 34 and actuator 36 (collectively "hard drive controller circuits").

The lateral and longitudinal dimensions of conventional hard drives are constrained by the sizes required to accommodate the hard drive platters and the head actuator mechanisms. Accordingly, there is a relatively large amount of circuit board area ("real estate") available on conventional printed circuit boards such as printed circuit board 38. This real estate is not generally fully utilized, so conventional hard drive controller printed circuit boards tend to be sparsely populated with components.

Figure 4:
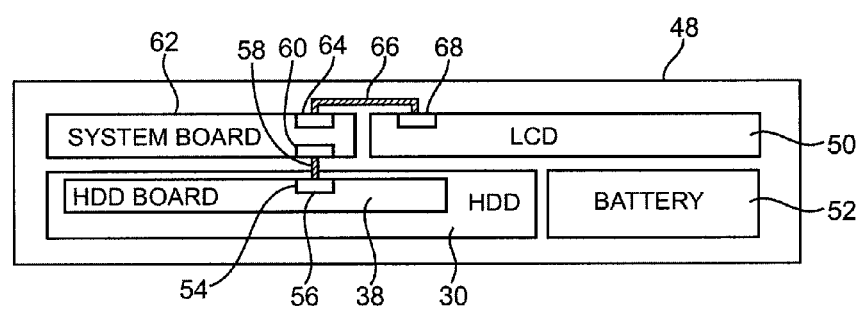
FIG. 4 is a cross-sectional side view of a conventional portable electronic device containing a conventional hard drive of the type shown in FIG. 3.

A cross-sectional view of a conventional handheld electronic device that includes a hard drive such as conventional hard drive 30 of FIG. 3 is shown in FIG. 4. As shown in FIG. 4, handheld electronic device 48 may contain a display 50, a battery 52, hard drive 30, and a system board such as system board 62. The components of device 48 may be interconnected using communications paths such as paths 58 and 66. For example, hard drive controller board 38 may be electrically connected to a main system board such as system board 62 using path 58. Path 58 may be formed from a flex circuit bus. Flex circuits (also sometimes referred to as flexible printed circuit boards) may be formed from flexible dielectrics such as polyimide with conductive traces.

In the arrangement of FIG. 4, flex circuit 58 is connected to hard drive controller board 38 by connector 54 and is connected to system board 62 by connector 60. Similarly, a communications path such as path 66 (e.g., a flex circuit) may be connected to system board 62 using connector 64 and may be connected to display 50 using connector 68. Battery 52 may be connected to system board 62 using wires.

System board 62 may be used to mount components such as a processor integrated circuit, an audio integrated circuit, memory chips, and other electrical components for device 48. Hard drive controller components such as the motor and actuator controller chips for drive 30 are mounted on hard drive controller board 38. This type of arrangement may be satisfactory for some applications, but tends to be inefficient, because system board 62 consumes potentially valuable space within the housing of device 48. This space may, for example, limit the size of display 50.

Figure 5:
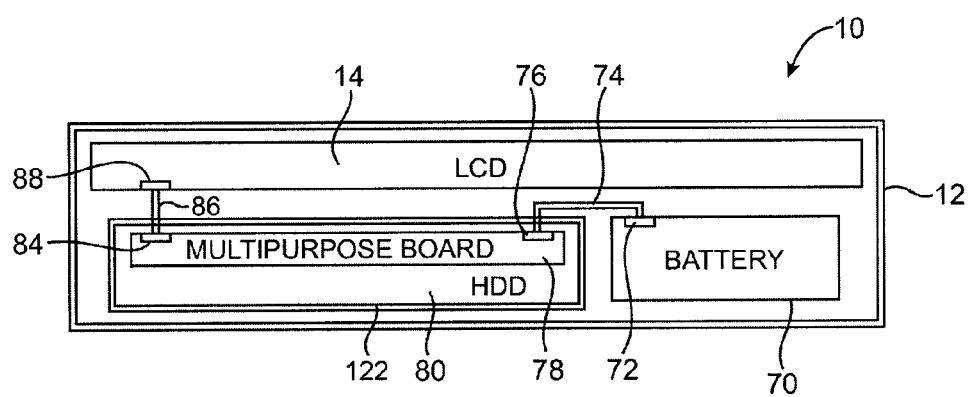
FIG. 5 is a cross-sectional side view of an illustrative portable electronic device containing a hard drive with a multipurpose printed circuit board in accordance with an embodiment of the present invention.

An illustrative handheld electronic device 10 in accordance with an embodiment of the present invention is shown in the cross-sectional view of FIG. 5. As shown in FIG. 5, device 10 may include components such as battery 70, hard drive 80, and display 14. These components may be housed within a housing such as housing 12. Hard drive 80 may include a multipurpose circuit board 78. Circuit board 78 may include both system components and hard drive controller components. For example, circuit board 78 may include system components such as a main processor integrated circuit, system memory, and audio chips and traditional hard drive controller components such as controller integrated circuits for the platter motor and head actuator. Board 78 may provide some or all of the system board real estate that would conventionally be provided by system boards such as system board 62 of FIG. 4. As a result, the total amount of space within device 10 that is consumed by printed circuit boards and their associated components may be reduced, thereby allowing other components to be provided in larger sizes. In the FIG. 5 arrangement, for example, display 14 has been enlarged relative to the size of conventional display 50 of FIG. 4.

The components of device 10 may be interconnected using any suitable connection arrangement. For example, flex circuit paths, wires, other suitable paths may be used to distribute signals. As shown in FIG. 5, battery 70 may be connected to multipurpose board 78 using path 74. Path 74 may be connected to battery 70 using a connector such as connector 72. Path 74 may be connected to multipurpose board 78 using a connector such as connector 76. Path 86 (e.g., a flex circuit path) may be connected to board 78 using connector 84 and may be connected to display 14 using connector 88.

Connectors such as connectors 88, 84, 76, and 72 may be formed using any suitable connector arrangement. Examples of connectors that may be used include zero insertion force (ZIF) connectors, board-to-board connectors, soldered wire connectors, connectors that use conductive foam, and conductive structures that use anisotropic conductive film (as examples). Paths such as paths 86 and 74 may be formed using wire (e.g., stranded wire), flex circuits, rigid printed circuit board structures, metal clips, springs, combinations of these structures, etc.

Illustrative layouts that may be used for the components on multipurpose board 78 are shown in the cross-sectional views of FIGS. 6, 7, 8, and 9. Board 78 may be populated with integrated circuits and other components (e.g., system components such as the components associated with storage 26, processing circuitry 22, and input-output circuitry 24 of FIG. 2). Some of the components on board 78 may be associated with hard drive control functions. These components, which are labeled "HD" in the illustrative examples of FIGS. 6, 7, 8, and 9, may include, for example, a spindle motor controller and a hard-drive head actuator controller and may be provided in the form of one or more integrated circuits and associated discrete devices. The remaining components (i.e., the unlabeled components in the examples of FIGS. 6, 7, 8, and 9) may be system components such as processing integrated circuits (e.g., microprocessors, digital signal processors, custom processors), application specific integrated circuits, audio codecs, volatile and nonvolatile memory chips, power management unit chips, display drivers, jacks and other connectors, and other system integrated circuits and discrete components.

Both system components and hard-drive controller components are depicted as components 92 in FIGS. 6, 7, 8, and 9. A cylindrical hole or other such opening may be provided in board 78 to accommodate the hard drive spindle. This opening is shown as opening 90 in FIGS. 6, 7, 8, and 9.

Figure 6:
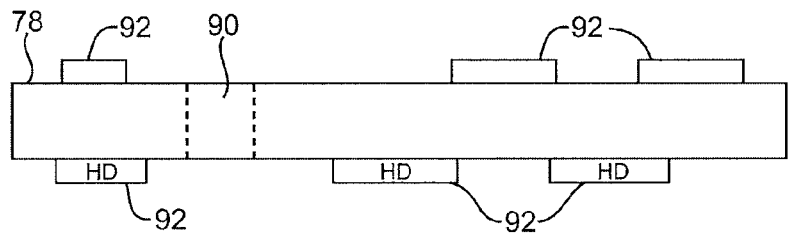
FIGS. 6, 7, 8, and 9 are cross-sectional side views of illustrative printed circuit boards that may be mounted in a hard drive in accordance with embodiments of the present invention.
Figure 7:
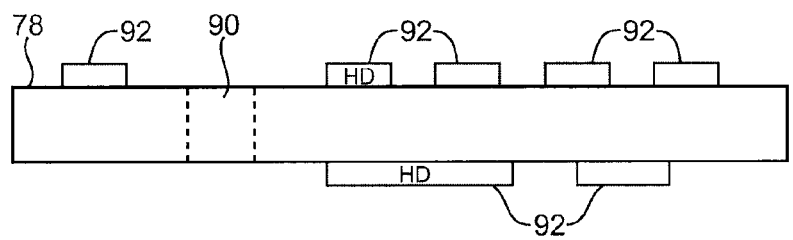

In the illustrative arrangements of FIGS. 6 and 7, system components 92 are mounted to both the upper and lower sides of board 78. In the example of FIG. 6, hard drive controller components are mounted only to the lower side of board 78, whereas system components are mounted to the upper side of board 78. In the example of FIG. 7, hard drive controller components and system components are intermingled. As this example demonstrates, hard drive controller components 92 may be mounted to either side of board 78 and system components 92 may be mounted to either side of board 78.

Figure 8:
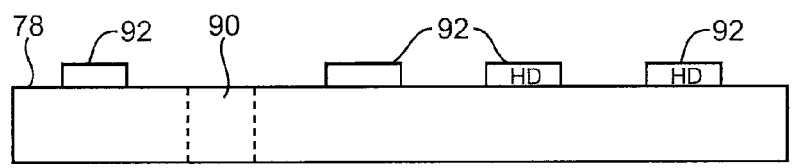
Figure 9:
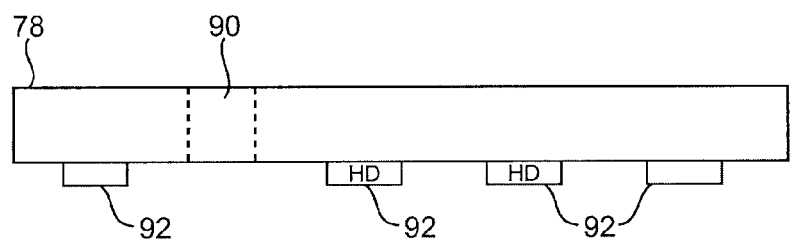

FIG. 8 presents an example in which system components 92 and hard drive components 92 are only mounted to the upper side of board 78 (i.e., the side of board 78 that faces away from hard drive 80). FIG. 9 presents an example in which system components 92 and hard drive components 92 are mounted only to the lower (inner) side of board 78. An advantage of the arrangement of FIG. 9 is that the board 78 of FIG. 9 has a fairly smooth outer surface that may help to accommodate additional components within device 10 such as display 14 (FIG. 5).

Figure 10:
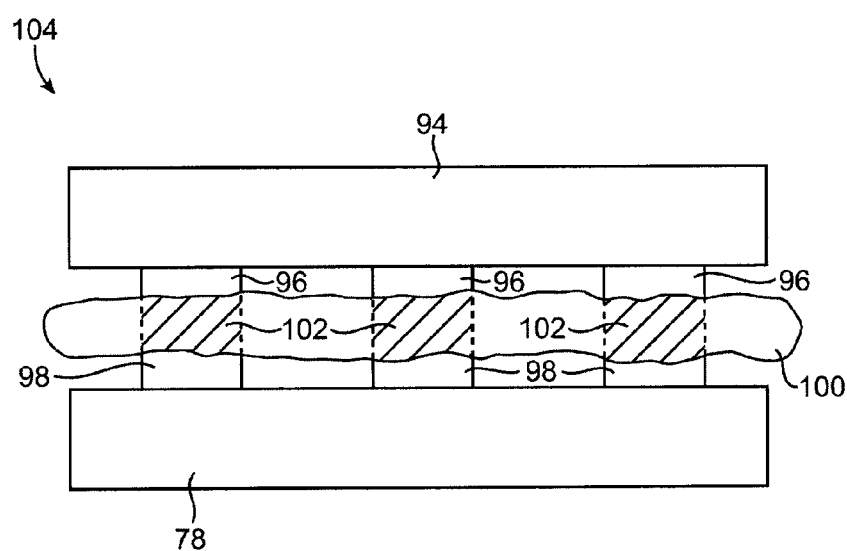
FIG. 10 is a cross-sectional side view showing how electrical connections in portable electronic devices may be made using anisotropic conductive film between mating conductive pads in accordance with an embodiment of the present invention.

If desired, connections between components may be formed using a film that becomes conductive with exposure to pressure. This type of connection may be used, for example, to mount an end of a flex circuit (e.g., a flex circuit path such a path 86 or path 74 of FIG. 5) to a board such as multipurpose board 78. As shown in the cross-sectional view of FIG. 10, connector 104 may form electrical pathways 102 between flex circuit 94 and board 78. Flex circuit 94 may have one or more conductive pads such as pads 96. Board 78 may have corresponding pads such as pads 98. Film 100 (which is sometimes referred to as an anisotropic conductive film) may be placed between pads 96 and 98. When flex circuit 94 is pressed against board 78, portions 102 that lie between protruding pads 96 and 98 are compressed and become conductive, thereby forming connector 104.

Figure 11:
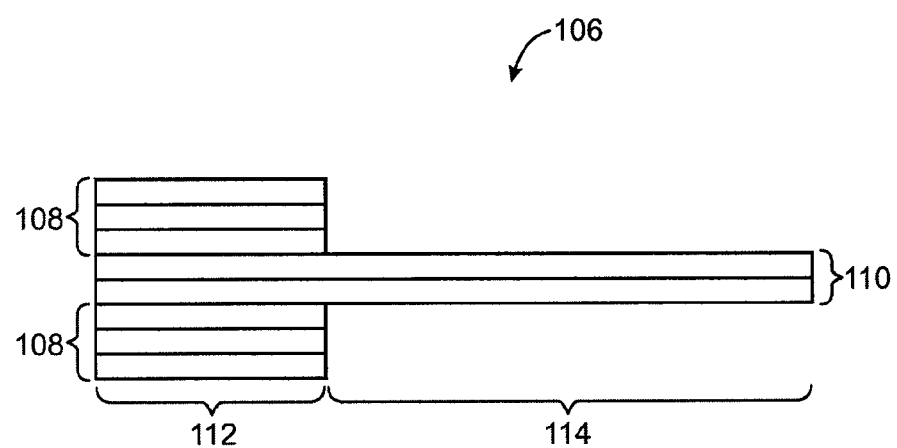
FIG. 11 is a cross-sectional side view of a rigid flex circuit board structure of the type that may be used as a multipurpose printed board structure mounted within a hard drive in a portable electronic device in accordance with an embodiment of the present invention.

If desired, multipurpose circuit board 78 may be formed from a rigid flex structure. Rigid flex circuits incorporate rigid circuit board portions and flex circuit portions in a unitary structure. An arrangement of this type is shown in FIG. 11. As shown in the cross-sectional view of FIG. 11, rigid flex 106 may include rigid printed circuit board layers such as layers 108. Rigid printed circuit board layers 108 may be formed, for example, from fiberglass-filled epoxy or other suitable rigid dielectrics. Rigid flex 106 also contains flex circuit layers such as flex circuit layers 110. Flex circuit materials that may be used for flex circuit portion 110 include polyimide and other flexible dielectrics. Conductive traces (e.g., of copper, gold, or other suitable conductors) may be patterned within layers 108 and 110 to form desired interconnection patterns, electrical buses, etc.

As shown in FIG. 11, at least some flex circuit portions in rigid flex 106 protrude from the rigid circuit board portions, so that some of rigid flex 106 is rigid (e.g., portion 112) and some of rigid flex 106 is flexible (e.g., portion 114). The use of interconnection arrangements such as the rigid flex arrangement of FIG. 11 to interconnect components in device 10 may help to reduce the number of connections that are formed in device 10 during assembly (e.g., by eliminating the need for some of the ZIF connectors, board-to-board connectors and other connectors that might otherwise be used in device 10).

For shock protection, it may be desirable to mount hard drive 30 so that there is some potential for movement relative to case 12. Shock mounting arrangements may involve encasing drive 30 in foam or ribbed plastic structures that can help hard drive 30 to absorb the force associated with an unintended impact on device 10. When such shock mounting arrangements are used, it may be advantageous to form connections to system board 78 using flexible electrical paths such as flex circuit paths and wires, rather than inflexible paths such as direct connections to circuit boards. The flexibility of electrical paths of this type may help to prevent damage to the electrical paths when device 10 is subjected to an impact.

Figure 12:
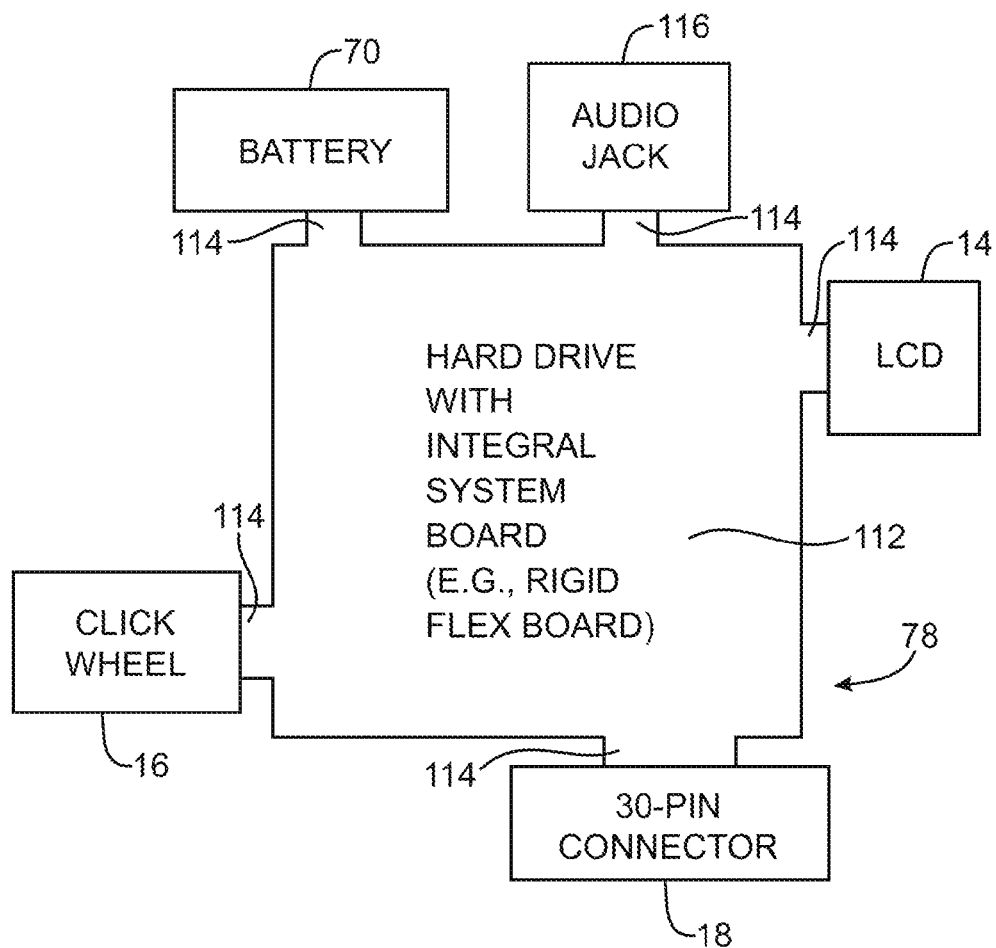
FIG. 12 is a top view of an illustrative circuit board arrangement such as a rigid flex circuit board arrangement that may be used in a portable electronic device in accordance with an embodiment of the present invention.

With one suitable arrangement, multipurpose board 78 may be formed from a rigid flex of the type shown in FIG. 11. A portion of the rigid flex may be rigid to accommodate the mounting of integrated circuits, whereas flexible tail portions may be used to form flexible electrical paths to other components. This type of arrangement is shown in FIG. 12. In the diagram of FIG. 12, central rectangular portion 112 represents an illustrative rigid portion of a rigid flex structure (e.g., a fiberglass-filled epoxy portion), whereas portions 114 represent flexible portions of the rigid flex structure (e.g., flex circuit tails). As shown in FIG. 12, flex circuit portions 114 of rigid flex board 78 may be used to form electrical pathways to components such as click wheel 16, 30-pin connector 18, battery 70, audio jack 116, and display 14. If desired, components such as battery 70 may be alternatively connected using stranded wire with soldered connections (as an example).

In the FIG. 12 example (and other examples in which board 78 is connected using flex circuit buses), flex tails may be connected using anisotropic conductive films, board-to-board connectors, solder connections (e.g., for low-pin-count components such as audio jack 116), or any other suitable connectors.

As described in connection with FIG. 12, it may be advantageous to form flex circuit paths between board 78 and other portions of device 10, because this allows a shock-mounted hard drive 30 to which board 78 is mounted to translate slightly relative to case 12 in the event that device 10 is subjected to an impact. If desired, translational motion of this type may be accommodated using other arrangements such as metal springs or clips (particularly for low-pin-count connections).

If desired, flexible paths may be provided between hard drive circuitry and peripheral components using other arrangements. As an example, a hard drive printed circuit board that is formed from rigid materials (e.g., a standard printed circuit board formed from fiberglass-filled epoxy or other printed circuit board materials) may be provided with flex circuit paths for interconnecting components by connecting flex circuits to the rigid printed circuit board using suitable connectors (e.g., board-to-board connectors, zero insertion force connectors, etc.). This type of hard drive printed circuit board may be mounted within the housing walls of the hard drive (i.e., as an integral portion of the hard drive) or may be otherwise attached to the hard drive.

A rigid hard drive printed circuit board that is mounted to a hard drive or that is formed integrally within a hard drive may also be provided with flexible tails by connecting flex circuits to the rigid printed circuit board using connectors formed from anisotropic conductive film. The circuitry on the rigid printed circuit board may be connected to components in the hard drive (e.g., a hard drive motor, an actuator for a hard drive head, etc.), whereas the flex circuit paths may be connected to input-output components in the handheld device.

In the FIG. 12 example, it was described how a rigid flex printed circuit board that is attached to a hard drive or that is formed integrally within the hard drive may be provided with flex circuit tail portions that are connected to input-output connector 18, liquid crystal display 14, audio jack 116, battery 70, click wheel 16, and other suitable components. If desired, such rigid flex arrangements may be used in conjunction with other printed circuit board arrangements. For example, a rigid flex with flex circuit tails may be used to form connections to some of the components in a handheld device whereas a rigid printed circuit board with attached flex circuit paths may be used to interconnect other components in device 10. If desired, all or most of the hard drive and system circuitry that would otherwise be mounted on a rigid printed circuit board or a rigid flex in a hard drive may be formed on a flex printed circuit. All or part of this flex circuit may be mounted within the housing of the hard drive. Both hard drive controller circuits and system circuits may be mounted on the flex circuit. Flex circuit tails that extend from this type of integral flex circuit may be used in forming electrical connections to components such as input-output connector 18, liquid crystal display 14, audio jack 116, battery 70, click wheel 16, and other suitable components.

Figure 13:
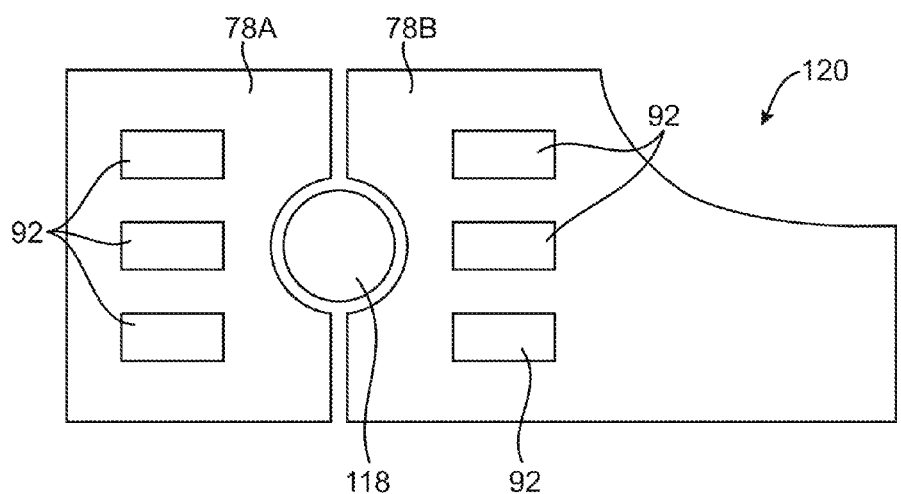
FIG. 13 is a top view of an illustrative two-part circuit board arrangement that may be used in a hard drive in a portable electronic device in accordance with an embodiment of the present invention.

Board 78 may be provided in the form of multiple subboards such as subboards 78A and 78B in the example of FIG. 13. As shown in FIG. 13, boards 78A and 78B may form a circular opening that accommodates hard drive motor spindle 118 and an opening 120 that accommodates an actuator for the hard drive head actuator arm.

Figure 14:
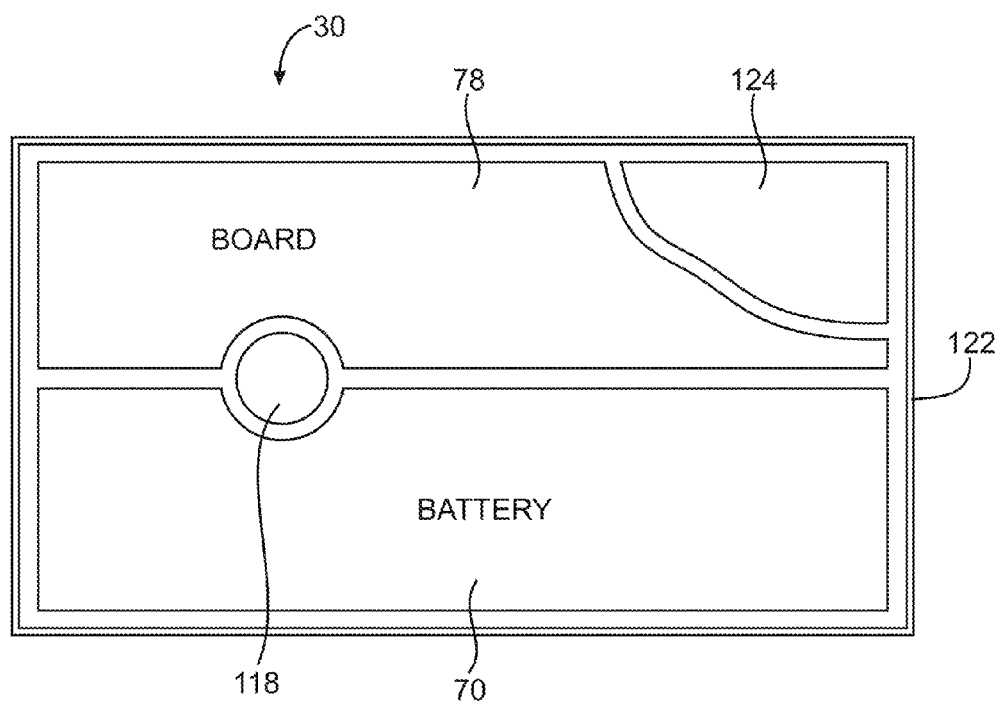
FIG. 14 is a top view of an illustrative circuit board arrangement that may be used to accommodate an additional component such as a battery within the confines of a hard drive in a portable electronic device in accordance with an embodiment of the present invention.

Another illustrative arrangement is shown in FIG. 14. As shown in FIG. 14, multipurpose board 78 need not be the only device that is mounted within hard drive case 122 of hard drive 30. Other components (e.g., battery 70 in the FIG. 14 example) may be accommodated in the spaces between the vertical walls of case 122, spindle 118, and actuator 124.

Figure 15:
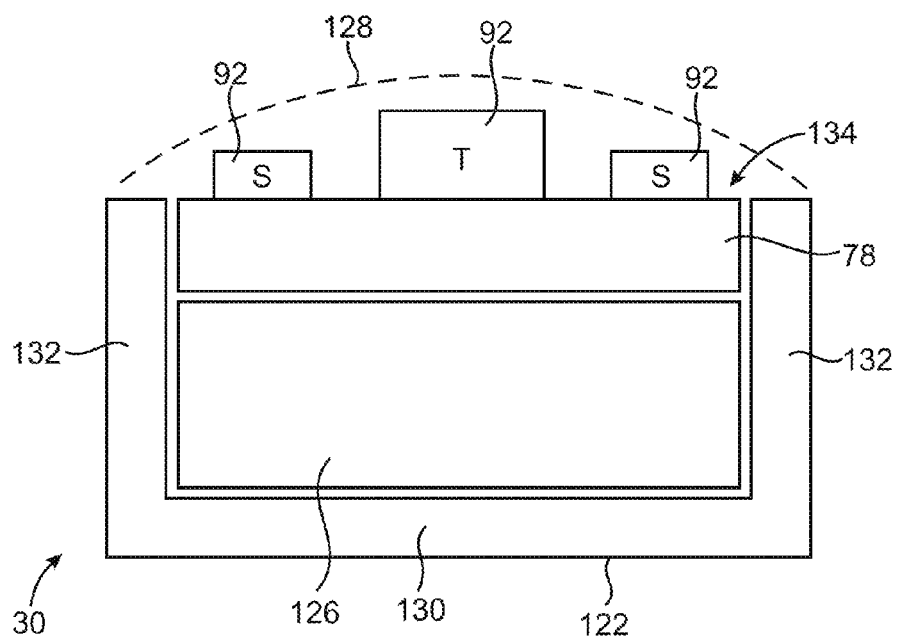
FIG. 15 is a cross-sectional end view of an illustrative hard drive having a multipurpose circuit board in accordance with an embodiment of the present invention.

A cross-sectional end view of an illustrative hard drive 30 with a multipurpose circuit board 78 is shown in FIG. 15. As shown in FIG. 15, hard drive case 122 may have a lower surface 130 (e.g., a rectangular planar surface), and sidewalls 132. Upper portion 134 of case 122 may be substantially open (as an example). Case 122 may be formed from metal or other suitable materials.

Hard drive components 126 may include magnetic platters, motor components, head actuator arms, etc. Multipurpose circuit board 78 may, as shown in FIG. 15, generally be mounted within the confines of walls 132. If desired, components 92 may be mounted on board 78 according to their heights. For example, tall components 92 (e.g., the component labeled "T" in the FIG. 15 example) may be placed near the center of board 78, whereas shorter components (e.g., the components labeled "S" in the FIG. 15 example) may be placed near the edges of board 78. This forms an arrangement of components 92 that varies in height according to dashed line 128. This type of configuration may be used, for example, when hard drive 30 is mounted within a device 10 that has a curved housing 12.

The foregoing is merely illustrative of the principles of this invention and various modifications can be made by those skilled in the art without departing from the scope and spirit of the invention.

What is claimed is:

1. A portable electronic device, comprising:
   a portable electronic device housing;
   input-output circuitry;
   processing circuitry coupled to the input-output circuitry; and
   storage coupled to the processing circuitry, wherein the storage includes a hard drive having:
      a hard drive housing mounted within the portable electronic device housing;
      hard drive electrical components mounted within the hard drive housing; and
      a printed circuit board mounted within the hard drive housing to which portable electronic device system components and hard drive controller components are mounted.

2. The portable electronic device defined in claim 1 wherein the printed circuit board comprises a rigid flex circuit board.

3. The portable electronic device defined in claim 1 wherein the input-output circuitry comprises a display, wherein the printed circuit board comprises a rigid circuit board portion and a flexible circuit board portion, and wherein the flexible circuit board portion is connected to the display.

4. The portable electronic device defined in claim 1 wherein the input-output circuitry comprises at least one button and an audio jack, wherein the printed circuit board comprises a rigid circuit board portion and at least two flexible circuit board portions, and wherein the at least two flexible circuit board portions are connected to the at least one button and the audio jack, respectively.

5. The portable electronic device defined in claim 4 wherein the at least one button comprises a click wheel that includes multiple buttons.

6. The portable electronic device defined in claim 1 wherein the portable electronic device system components include an integrated circuit selected from the group consisting of: a microprocessor, an audio codec integrated circuit, and a system memory.

7. The portable electronic device defined in claim 1 wherein the processing circuitry is mounted on the printed circuit board.

8. The portable electronic device defined in claim 1 wherein the input-output circuitry comprises a radio-frequency transceiver.

9. The portable electronic device defined in claim 1 wherein the input-output circuitry comprises a dock connector that receives data and power signals.

10. An electronic device, comprising:
    an electronic device housing;
    a storage device having a storage device housing and a rigid flex system board mounted within the storage device housing, wherein portable electronic device system components are mounted on the rigid flex system board; and
    input-output components, wherein the rigid flex system board has a rigid portion that is integral to the storage device and has flexible tails that interconnect the rigid flex system board with the input-output components.

11. The electronic device defined in claim 10 wherein the storage device comprises a solid state drive having nonvolatile memory.

12. The electronic device defined in claim 11 wherein the storage device comprises a hard disk drive.

13. The electronic device defined in claim 12 wherein the input-output components comprise at least one button.

14. The electronic device defined in claim 13 wherein the input-output components further comprise a display.

15. The electronic device defined in claim 14, wherein said portable electronic device system components are mounted on the rigid portion of the rigid flex system board.

16. An electronic device, comprising:
    a multipurpose circuit board having a surface, wherein the surface has a central portion and a peripheral portion;
    first and second components mounted on the surface, wherein the first and second components have respective first and second heights relative to the surface, wherein the first height is greater than the second height, wherein the first component is mounted on the central portion of the surface and the second component is mounted on the peripheral portion of the surface, and wherein the components comprise electronic device system components and hard drive controller components;

an electronic device housing;

a hard drive case mounted within the electronic device housing, wherein the multipurpose circuit board is mounted within the hard drive case; and a hard drive mounted within the hard drive case.

17. The electronic device defined in claim 16, wherein the multipurpose circuit board comprises a multipurpose rigid flex circuit board.

18. The electronic device defined in claim 17, further comprising:

a display, wherein the multipurpose rigid flex circuit board comprises a rigid circuit board portion and a flexible circuit board portion, and wherein the flexible circuit board portion is connected to the display.

* * * * *

UNITED STATES PATENT AND TRADEMARK OFFICE
CERTIFICATE OF CORRECTION

| | | |
|---|---|---|
| PATENT NO. | : 8,159,777 B2 | Page 1 of 1 |
| APPLICATION NO. | : 12/360815 | |
| DATED | : April 17, 2012 | |
| INVENTOR(S) | : Stephen P. Zadesky et al. | |

It is certified that error appears in the above-identified patent and that said Letters Patent is hereby corrected as shown below:

In the Claims:

Column 11, lines 3-4 (Claim 16, lines 10-11): "the components" should read --the first and second components--.

Signed and Sealed this
Fourteenth Day of April, 2015

Michelle K. Lee
*Director of the United States Patent and Trademark Office*